(12) United States Patent
Fukano et al.

(10) Patent No.: US 6,251,765 B1
(45) Date of Patent: Jun. 26, 2001

(54) MANUFACTURING METAL DIP SOLDER BUMPS FOR SEMICONDUCTOR DEVICES

(75) Inventors: Atsuyuki Fukano, Addison; Nobuo Takeda, Richardson, both of TX (US)

(73) Assignee: Ball Semiconductor, Inc., Allen, TX (US)

( * ) Notice: Subject to any disclaimer, the term of this patent is extended or adjusted under 35 U.S.C. 154(b) by 0 days.

(21) Appl. No.: 09/350,041

(22) Filed: Jul. 8, 1999

Related U.S. Application Data

(60) Provisional application No. 60/092,435, filed on Jul. 10, 1998.
(51) Int. Cl.[7] ................................................. H01L 21/44
(52) U.S. Cl. ............................................ 438/612; 438/613
(58) Field of Search ...................................... 438/612, 613

(56) References Cited

U.S. PATENT DOCUMENTS 5,143,865 * 9/1992 Hideshima et al. ................. 438/612
5,955,776    9/1999 Ishikawa .

* cited by examiner

Primary Examiner—John F. Niebling
Assistant Examiner—Lynne A. Gurley
(74) Attorney, Agent, or Firm—Haynes and Boone, LLP

(57) ABSTRACT

A system and method for forming solder bumps on a surface of a semiconductor device, such as a spherical-shaped semiconductor integrated circuit, is disclosed. Multiple devices are first aligned so that a vacuum chuck can hold all of the devices with an appropriate orientation. The vacuum chuck can then dip the devices into different molten metal compounds to form a plurality of solder bumps. Metal solder materials of different melting points are chosen so that the thickness of the solder bumps are partially controlled by the number of layers of solder metal sequentially grow on the metal pads. Once the solder bumps are grown on the devices, the vacuum chuck can immediately transfer the devices to a tape and reel assembly for further transportation thereof. It can also be easily fed into a tube assembly which protects the spherical shaped semiconductor device with the solder bumps during the shipping process.

16 Claims, 3 Drawing Sheets

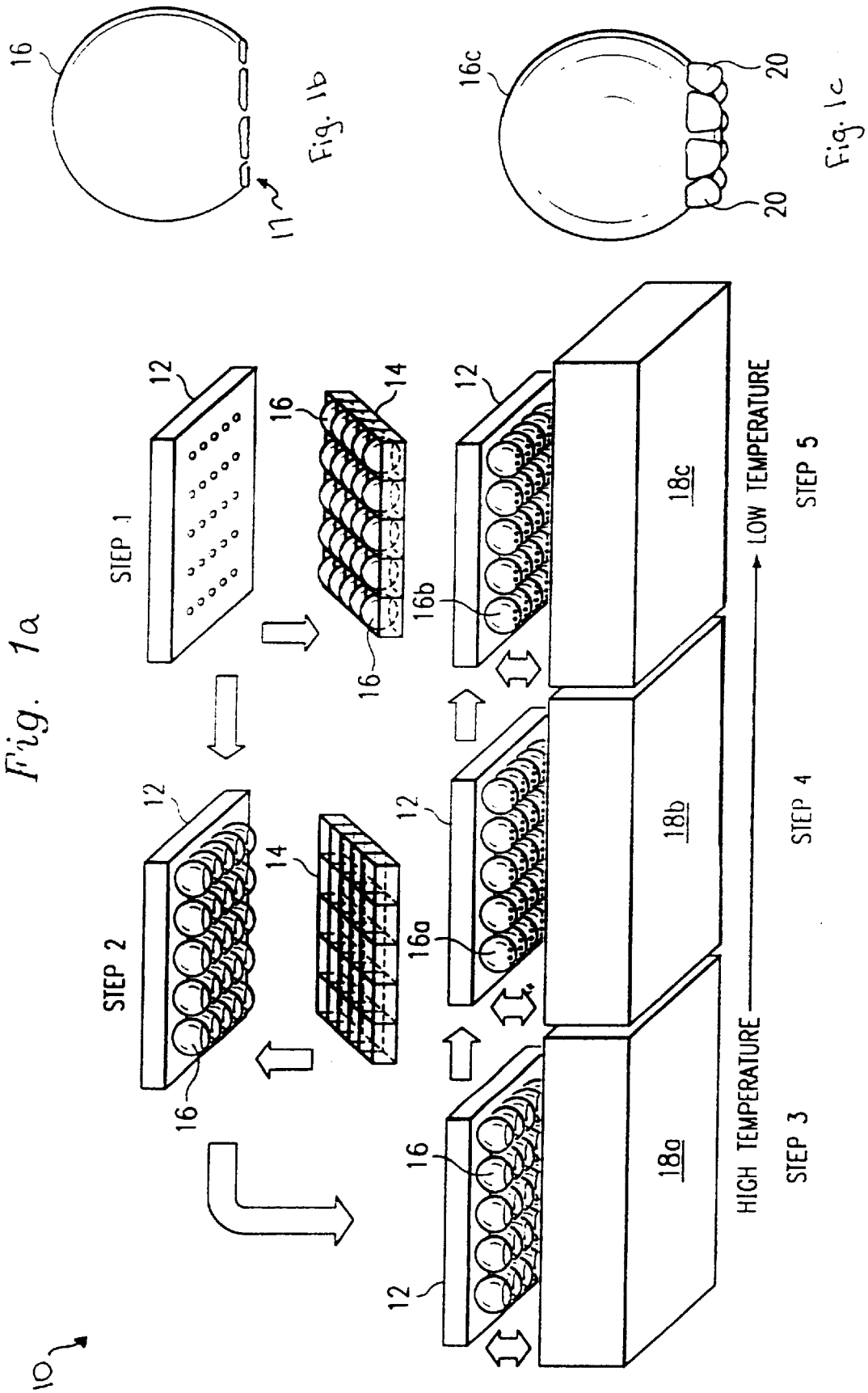

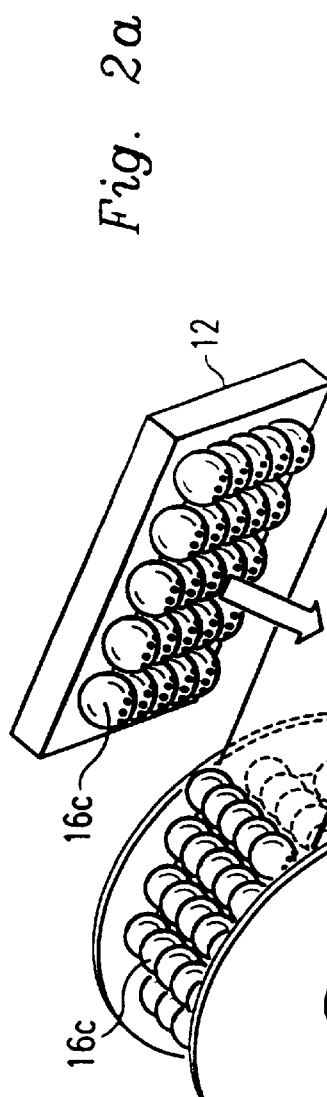
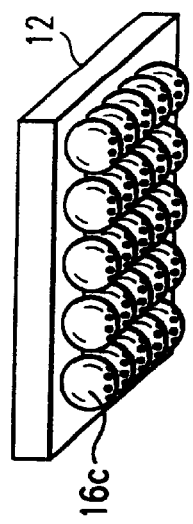
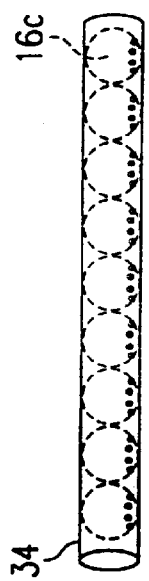
Fig. 2a
Fig. 2b

MANUFACTURING METAL DIP SOLDER BUMPS FOR SEMICONDUCTOR DEVICES

CROSS REFERENCE

This application claims the benefit of U.S. Provisional Patent Application Ser. No. 60/092,435 filed Jul. 10, 1998, which is herein incorporated by reference.

BACKGROUND OF THE INVENTION

The invention relates generally to semiconductor integrated circuits, and more particularly, to an apparatus and method for forming metal (e.g., solder) bumps onto a surface of a semiconductor integrated circuit, such as a spherical-shaped semiconductor device.

Conventional integrated circuit devices, or "chips," are formed from a flat surface semiconductor wafer. The semiconductor wafer is first manufactured in a semiconductor material manufacturing facility and is then provided to a fabrication facility. At the latter facility, several layers are processed onto the semiconductor wafer surface. Once completed, the wafer is then cut into one or more chips and assembled into packages. Usually, electrical connections are made inside the packages from the input and output pads of the chip to the input and output pins or leads of the packages. Thereafter, the packages are secured to a circuit board or seated into reception sockets which can then be soldered to the circuit board. There are many different types of packages, including solid lead packages (e.g., PDIP, SOJ), and various solder bump packages (e.g., flip chip). For the solder bump-type packages, solder bumps make electrical connections directly between the chip and the circuit board or the reception socket.

In U.S. patent application Ser. No. 08/858,004 filed on May 16, 1997, a method and apparatus for manufacturing spherical-shaped semiconductor integrated circuit devices is disclosed. One way to connect the spherical shaped semiconductor devices to packages or circuit boards is to use multiple micro metal balls or stud bumps at certain areas of each spherical shaped semiconductor device. This can be an expensive process since not only do the stud bumps or micro metal balls have to be manufactured separately, additional steps must be taken to carefully connect them to predetermined locations of the spherical shaped semiconductor device.

What is needed is a system and method for effectively and economically forming solder bumps on a surface of a semiconductor integrated circuit, such as a spherical-shaped semiconductor device.

SUMMARY OF THE INVENTION

The present invention discloses a system and method for efficiently and economically forming solder bumps on the surface of a semiconductor integrated circuit, such as a spherical-shaped semiconductor device. Using solder bumps eliminates an expensive manufacturing process step for the device. Further, it also eliminates the need to plant stud bumps and micro balls carefully to certain locations on devices such as a spherical shaped semiconductor device.

In one of the embodiments, a batch of spherical shaped semiconductor devices can be held by a vacuum chuck and dipped into different molten metal compounds to form a plurality of solder bumps. A method is disclosed for aligning the spherical shaped semiconductor devices in such a way that the vacuum chuck can hold all of the devices with an appropriate orientation. The spherical shaped semiconductor devices are preprocessed to have certain metal electrode pads on them to induce the growth of the bumps when the devices are dipped in solder materials. In some embodiments, different solder materials having various melting points are utilized to support sequential applications of solder layers on the electrode pads. Among various factors that collectively control the characteristic of the solder bumps, viscosities of solder material and the size of the electrode pads are two important factors that significantly affect the end result of the dipping process. Once the solder bumps are grown on the spherical shaped semiconductor devices, the vacuum chuck can immediately transfer the devices to a tape-and-reel assembly for further transportation thereof. It can also be easily fed into a tube assembly which also protects the spherical shaped semiconductor device with the solder bumps during the shipping process.

As such, the present invention helps to mass produce solder bumps connected to semiconductor devices and arrange such processed devices in economical shipping assemblies. It can thereby effectively reduce the overall cost of manufacturing such semiconductor devices.

BRIEF DESCRIPTION OF THE DRAWINGS

FIG. 1a is a flow chart of a system and method for making metal dip bumps on a plurality of spherical-shaped integrated circuit devices according to one embodiment of the invention.

FIG. 1b is a diagram of one of the spherical shaped semiconductor devices of FIG. 1a having electrode pads thereon.

FIG. 1c is a diagram of one of the spherical shaped semiconductor devices of FIG. 1a having metal solder bumps grown thereon.

FIG. 2a is a diagram illustrating a tape and reel shipping assembly.

FIG. 2b is a diagram illustrating a tube-type shipping assembly.

DESCRIPTION OF THE PREFERRED EMBODIMENT

Figure 3:
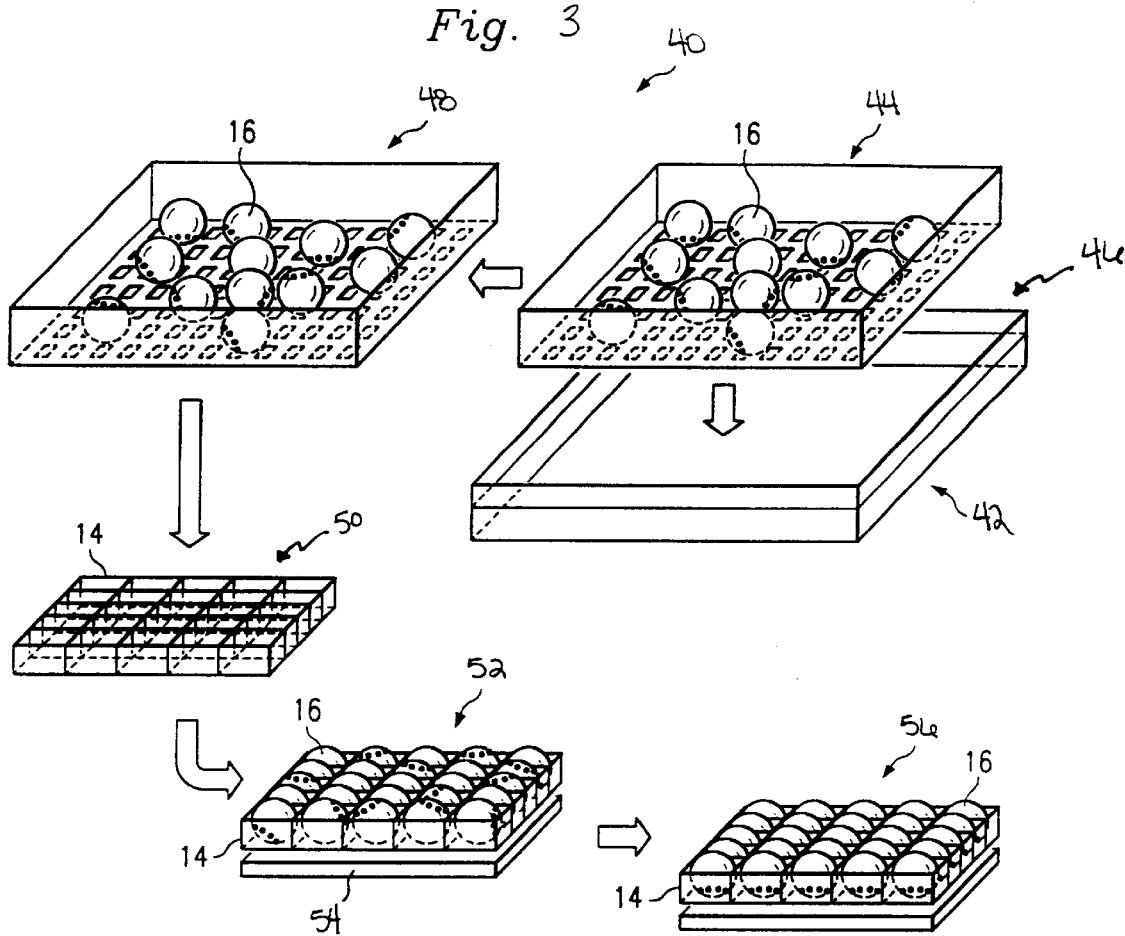
FIG. 3 is a flow chart of a system and method for aligning the spherical-shaped integrated circuit devices to properly position their electrode pads.

The following disclosure provides many different embodiments, or examples, for implementing different features of the invention. Techniques and requirements that are only specific to certain embodiments should not be imported into other embodiments. Also, specific examples of chemicals, components, and processes are described below to help clarify the invention. These are, of course, merely examples and are not intended to limit the invention from that described in the claims.

Referring to FIG. 1a, the reference numeral 10 designates, in general, a system for making metal dip bumps on a spherical-shaped integrated circuit device. A vacuum chuck 12 includes an array of apertures capable of selectively applying a negative pressure. At step 1, the chuck 12 is lowered near a tray 14 of spherical shaped devices 16. The devices include metal electrode pads 17 for receiving and adhering to solder.

Referring also to FIG. 1b gives a detailed view of the spherical-shaped integrated circuit device having such electrode pads 17 installed thereon. The electrode pads 17 provide foundations for growing solder bumps. For example, it is known that Cu, Ni, and Al are common materials used in electrode pads. An electrode pad is usually made of a few layers of different metals, the combination of which defines the overall characteristic of the electrode pads. Moreover, in general, different sizes of the pads induce solder bumps of different heights. Usually, for a certain type of solder material, a linear relation can be found between the size of the electrode pad and the average height of solder bump grown thereon, i.e., the bigger the electrode pad, the taller the solder bump.

Referring again to FIG. 1a, a negative pressure is applied so that at step 2, the devices 16 adhere to the chuck 12. At step 3, the chuck 12 and devices 16 are lowered into a tray 18a of molten solder material. The solder material in the tray 18a is at a first temperature that is relatively high.

Once the electrode pads 17 have contacted the solder material, the chuck 12 lifts the devices out of the tray 18a and waits for a predetermined time to allow the solder material to solidify on the electrode pads. The devices (now designated devices 16a) form relatively small solder bumps on the pads 17. At step 4, the chuck 12 and devices 16a are lowered into another tray 18b of molten solder. The tray 18b is at a second temperature that is lower than the first temperature of tray 18a. The second temperature is low enough to prevent any solder bumps formed from tray 18a to remain relatively intact.

Once the electrode pads 17 have contacted the solder material, the chuck 12 lifts the devices out of the tray 18b and waits for a predetermined time to allow the solder material to solidify on the previously formed solder bumps. The devices (now designated devices 16b) will have even larger solder bumps on the pads 17. At step 5, the chuck 12 and devices 16b are lowered again into another tray 18c of molten solder. The tray 18c is at a third temperature that is lower than the second temperature of tray 18b. Once the electrode pads 17 have contacted the solder material, the chuck 12 lifts the devices out of the tray 18c and waits for a predetermined time to allow the solder material to solidify on the previously formed solder bumps. As a result, the devices are now fully processed and have relative large solder bumps formed on their electrode pads 17. FIG. 1c provides an example of one fully processed device, designated as device 16c, with a plurality of solder bumps 20 formed onto a plurality of corresponding electrode pads 17.

Referring to FIG. 2a, in one embodiment, the devices 16c can be off loaded from the chuck 12 onto a tape 30 and combined in a reel 32. Tape and reel is a common commercial package for shipping semiconductor devices. Loading batches of spherical shaped semiconductor devices while they are still held by the chuck is advantageous in the process since it can be done immediately after the solder bumps have cooled down.

Referring to FIG. 2b, in another embodiment, the devices 16c can be off loaded and stored inside a tube 34. An intermediate step may be required to off-load the devices from the chuck 12 and feed them sequentially to the tube 34.

It is noted that in the system of FIG. 1a, the devices 16 were pre-aligned in the tray 14. Referring now to FIG. 3, a flow diagram for a system 40 to align the devices 16 is shown. The alignment process aligns all the devices in a fixed pattern that matches the aperture pattern on the chuck assembly 12 so that each aperture can hold a device when a negative vacuum is applied. The alignment process also directs the electrode pads 17 downward (i.e., towards the appropriate tray) so that they can be dipped into the solder materials. In step 42, the devices 16 are randomly seated in a basket 44. The basket 44 is submerged into a magnetized metal pool 46, which contains a molten solution of magnetized material such as a combination of Ni (Nickel) and B (Boron). Only the material for the electrode pads 17 (e.g., Cu, Ni, or Al) will become plated with the Ni—B metal solution, leaving the rest of the semiconductor device uncoated. Therefore, only the electrode pads on the devices 16 are coated with small amount of the magnetized material. At step 48, the basket 44 is lifted from the Ni—B metal solution, the devices 16 are rinsed with de-ionized water, and then dried with a drying gas such as $N_2$. Then, in step 50, the devices are put in the tray 14 wherein each device is aligned in a fixed pattern by being confined to a small compartment. Subsequently in step 52, the devices 16 in the tray 14 are immersed in de-ionized water and vibrated by ultrasonic wave from a magnetic field. The magnetic field can be provided by positioning a magnet 54 at the bottom of the tray 14. At step 56, the magnetized pads 17 on the devices 16 are attracted to the magnet 54, thereby aligning the devices 16 in the tray 14 as shown in FIG. 3.

It is understood that several variations may be made in the foregoing. Modifications, changes and substitutions are intended in the foregoing disclosure and in some instances some features of the invention will be employed without a corresponding use of other features. Accordingly, it is appropriate that the appended claims be construed broadly and in a manner consistent with the scope of the invention.

What is claimed is:

1. A method for growing a plurality of metal solder bumps on a semiconductor device, the method comprising the steps of:
    forming a plurality of electrode pads on the semiconductor device;
    securing the semiconductor device to a chuck;
    dipping the secured semiconductor device into a first container of molten solder material; and
    dipping the semiconductor device into a second container of molten solder material, wherein the solder material in the second container is at a temperature that is less than a melting point of the solder material from the first container.

2. The method of claim 1 wherein the chuck is capable of simultaneously securing a plurality of semiconductor devices for simultaneous dipping.

3. The method of claim 2 wherein the semiconductor devices are spherical shaped and wherein the chuck secures the semiconductor devices by applying a negative pressure.

4. A method for growing a plurality of metal solder bumps on a semiconductor device, the method comprising the steps of:
    forming a plurality of electrode pads on the semiconductor device;
    securing the semiconductor device to a chuck;
    dipping the secured semiconductor device into a first container of molten solder material; and
    aligning the semiconductor device to position the electrode pads for dipping in the first container, wherein the aligning includes the steps of:
        applying magnetic material to the electrode pads;
        placing the semiconductor device in a fluid; and
        applying a magnetic force to the semiconductor device while in the fluid so that the semiconductor device can move to align the electrode pads with the magnetic force.

5. The method of claim 4 wherein the aligning further includes the step of:
    vibrating the semiconductor device while the magnetic force is applied.

6. The method of claim 5 wherein the chuck is capable of simultaneously securing a plurality of semiconductor devices for simultaneous dipping and aligning and wherein the semiconductor devices are spherical shaped.

7. The method of claim 6 further comprising:
placing the semiconductor device, along with the plurality of semiconductor devices, into a basket for aligning.

8. A method for growing a plurality of metal solder bumps on a plurality of spherical shaped semiconductor devices, the method comprising the steps of:
affixing a plurality of electrode pads on the semiconductor devices; and
sequentially dipping the semiconductor devices into a plurality of respectively cooler molten solder materials;
wherein each type of metal solder material grows solder bumps around the metal pads.

9. The method of claim 8 wherein the step of sequentially dipping further include the steps of:
aligning the spherical shaped semiconductor device with all the electrode pads pointing a predetermined direction; and
sequentially lowering a chuck with the semiconductor devices held thereunder into the plurality of molten solder materials.

10. The method of claim 8 wherein the first molten solder material has a higher melting point than the second molten solder material.

11. A method for growing a plurality of metal solder bumps on a plurality of spherical shaped semiconductor devices, wherein each of the spherical shaped semiconductor devices has a plurality of electrode pads preprocessed thereon, the method comprising the steps of:
growing the metal solder bumps on the electrode pads of each the spherical shaped semiconductor device by aligning the spherical shaped semiconductor devices, elevating the spherical shaped semiconductor devices by a chuck, lowering the chuck with the spherical shaped semiconductor devices into a first molten solder material having a first melting point, lowering the chuck with the spherical shaped semiconductor devices into a second molten solder material having a melting point lower than the first metal solder material, and lowering the chuck with the spherical shaped semiconductor devices into a third molten solder material having a melting point lower than the second metal solder material, wherein each metal solder material sequentially grows solder bumps on the electrode pads; and
packaging the device with the grown solder bumps immediately thereafter.

12. The method of claim 11 wherein the step of packaging further includes the step of arranging the spherical shaped semiconductor devices with a plurality of metal solder bumps grown thereon in a tape reel package directly from the chuck.

13. The method of claim 11 wherein the step of packaging further includes the step of arranging the spherical shaped semiconductor devices with a plurality of metal solder bumps grown thereon in a tube package directly from the chuck.

14. The method of claim 11 wherein the chuck has a plurality of apertures for applying a negative vacuum pressure to hold the spherical shaped semiconductor devices.

15. The method of claim 11 wherein the spherical shaped semiconductor devices are aligned such that all the electrode pads point downward.

16. The method of claim 11 wherein a time interval is allowed for the metal solder bumps to solidify after the chuck is elevated from a molten solder material and before it is lowered into another molten solder material.

* * * * *